United States Patent
Smeets et al.

(10) Patent No.: US 7,777,863 B2
(45) Date of Patent: Aug. 17, 2010

(54) LITHOGRAPHIC APPARATUS WITH MASK TO PREVENT EXPOSURE OF PERIPHERAL EXPOSURE REGION OF SUBSTRATE

(75) Inventors: Erik Marie José Smeets, Prinsenbeek (NL); Remko Wakker, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 368 days.

(21) Appl. No.: 11/806,265

(22) Filed: May 30, 2007

(65) Prior Publication Data

US 2008/0297748 A1    Dec. 4, 2008

(51) Int. Cl.
 *G03B 27/58* (2006.01)
(52) U.S. Cl. .......................................... 355/74; 355/72

(58) Field of Classification Search ................ 355/74, 355/72, 73, 75, 76, 53
See application file for complete search history.

(56) References Cited

U.S. PATENT DOCUMENTS

| | | | |
|---|---|---|---|
| 5,361,121 A | 11/1994 | Hattori et al. | 355/50 |
| 5,760,881 A | 6/1998 | Miyazaki et al. | 355/71 |
| 6,078,381 A | 6/2000 | Suzuki | 355/53 |
| 6,680,774 B1 | 1/2004 | Heinle | 355/72 |

*Primary Examiner*—Edward J Glick
*Assistant Examiner*—Chia-how Michael Liu
(74) *Attorney, Agent, or Firm*—Pillsbury Winthrop Shaw Pittman, LLP (57) ABSTRACT

A substrate table for a lithographic apparatus includes a mask constructed and arranged to prevent exposure of a peripheral exposure region of a substrate on the substrate table. The mask is attached to a moveable carrier. The moveable carrier has a range of movement which at least partially circumnavigates the substrate table.

11 Claims, 7 Drawing Sheets

LITHOGRAPHIC APPARATUS WITH MASK TO PREVENT EXPOSURE OF PERIPHERAL EXPOSURE REGION OF SUBSTRATE

FIELD

The present invention relates to a lithographic apparatus and particularly to apparatus for forming a peripheral exposure region on a surface of a photosensitive substrate.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the beam in a given direction (the "scanning"-direction) while synchronously scanning the substrate parallel or anti-parallel to this direction.

U.S. Pat. No. 6,680,774 discloses a method and apparatus for mechanically masking a wafer to form exposure exclusion regions. Masking in this sense refers to blocking radiation. This is done using a mask which is opaque to the wavelength of radiation used by the lithographic apparatus. The term "mask" used in this context has a different meaning from the conventional meaning in lithography, and refers to device which is used to block radiation rather than to pattern radiation. The mask is arranged to overhang a predetermined exposure exclusion region of a photosensitive surface of a wafer. The mask is positioned over the wafer prior to exposure of the wafer, thereby shielding the regions of the photosensitive surface underlying the mask.

Also disclosed in U.S. Pat. No. 6,680,774 is a mask handling system having motorized base from which a beam extends. The beam may be raised, lowered and rotated. Mounted on the distal end of the beam are three arms. Each arm has a contact member, and these collectively engage a mask to load it into position on the wafer. However, in loading the mask into its correct position, the mask passes over the underlying wafer, thereby directly exposing regions of the photosensitive surface thereto, which may cause debris to fall onto the wafer and contaminate the photosensitive surface of the wafer.

SUMMARY

According to an aspect of the invention, there is provided a substrate table for a lithographic apparatus. The substrate table comprises a mask constructed and arranged to prevent exposure of a peripheral exposure region of a substrate on the substrate table. The mask is attached to a moveable carrier. The moveable carrier has a range of movement which at least partially circumnavigates the substrate table.

According to an aspect of the invention, there is provided a substrate table for a lithographic apparatus. The substrate table includes a mask constructed and arranged to prevent exposure of a peripheral exposure region of a substrate on the substrate table. The mask comprises a ring having an internal diameter greater than the external diameter of the substrate. The ring is configured to be moveable from a position in which it does not overhang the substrate, to a position in which it overhangs a peripheral exposure region of the substrate.

According to an aspect of the invention, there is provided lithographic apparatus that comprises an illumination system constructed and arranged to condition a beam of radiation, and a support structure constructed and arranged to support a patterning device. The patterning device is configured to impart the radiation beam with a pattern in its cross-section. The apparatus also includes a substrate table constructed and arranged to hold a substrate, and a projection system constructed and arranged to project the patterned radiation beam onto a target portion of the substrate. The apparatus further comprises a mask having a concave edge. The mask is configured to be moveable relative to the substrate to prevent a selected peripheral exposure region of the substrate from being exposed by the radiation beam.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 2a is a schematic sectional drawing of an embodiment of an apparatus for masking a peripheral region of a wafer;

FIGS. 2b, 2c and 2d are schematic drawings, in plan view, of the apparatus of FIG. 2a;

FIG. 3a is a schematic sectional drawing of an embodiment of the apparatus for masking a peripheral region of a wafer;

FIGS. 3b, 3c and 3d are schematic drawings, in plan view, of the apparatus of FIG. 2a;

FIG. 7b is a schematic drawing, in plan view and magnified, of the mask of FIG. 7a;

DETAILED DESCRIPTION

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquidcrystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "patterning device" used herein should be broadly interpreted as referring to a device that can be used to impart a radiation beam with a pattern in its cross-section such as to create a pattern in a target portion of the substrate. It should be noted that the pattern imparted to the radiation beam may not exactly correspond to the desired pattern in the target portion of the substrate. Generally, the pattern imparted to the radiation beam will correspond to a particular functional layer in a device being created in the target portion, such as an integrated circuit.

A patterning device may be transmissive or reflective. Examples of patterning device include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The support structure holds the patterning device. It holds the patterning device in a way depending on the orientation of the patterning device, the design of the lithographic apparatus, and other conditions, such as for example whether or not the patterning device is held in a vacuum environment. The support can use mechanical clamping, vacuum, or other clamping techniques, for example electrostatic clamping under vacuum conditions. The support structure may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "projection lens" herein may be considered as synonymous with the more general term "projection system".

The illumination system may also encompass various types of optical components, including refractive, reflective, and catadioptric optical components for directing, shaping, or controlling the beam of radiation, and such components may also be referred to below, collectively or singularly, as a "lens".

The lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

Figure 1:
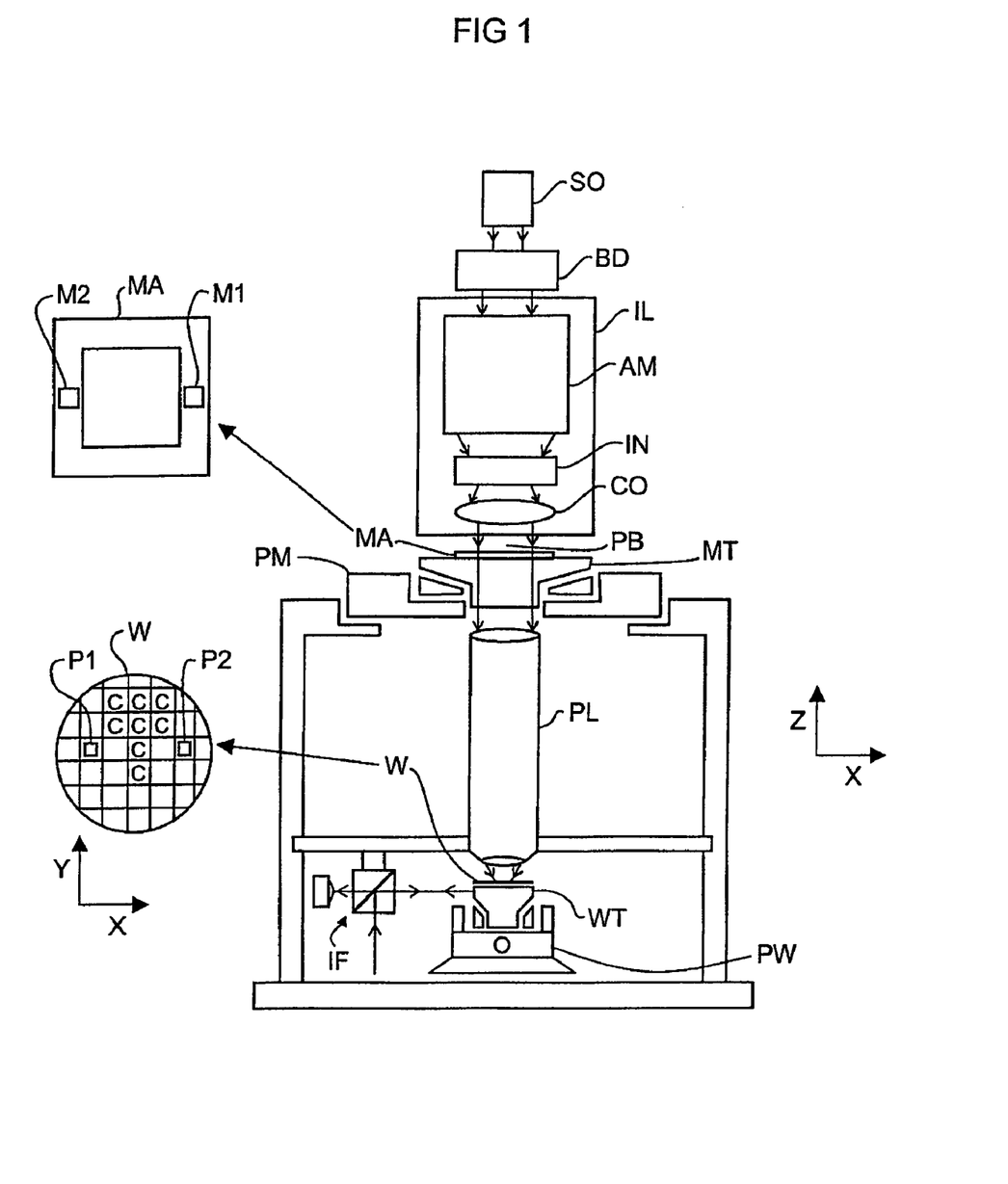
FIG. 1 is a schematic drawing of a lithographic apparatus according to an embodiment of the present invention.

FIG. 1 schematically depicts a lithographic apparatus according to a particular embodiment of the invention. The apparatus comprises an illumination system (illuminator) IL to condition a beam PB of radiation (e.g. UV radiation); a support structure (e.g. a support structure) MT to support a patterning device (e.g. a mask) MA and connected to first positioning device PM to accurately position the patterning device with respect to item PL; a substrate table (e.g. a wafer table) WT for holding a substrate (e.g. a resist-coated wafer) W and connected to second positioning device PW for accurately positioning the substrate with respect to item PL; and a projection system (e.g. a refractive projection lens) PL configured to image a pattern imparted to the radiation beam PB by patterning device MA onto a target portion C (e.g. comprising one or more dies) of the substrate W.

As here depicted, the apparatus is of a transmissive type (e.g. employing a transmissive mask). Alternatively, the apparatus may be of a reflective type (e.g. employing a programmable mirror array of a type as referred to above).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases the source may be integral part of the apparatus, for example when the source is a mercury lamp. The source SO and the illuminator IL, together with the beam delivery system BD if required, may be referred to as a radiation system.

The illuminator IL may comprise adjusting means AM for adjusting the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally comprises various other components, such as an integrator IN and a condenser CO. The illuminator provides a conditioned beam of radiation PB, having a desired uniformity and intensity distribution in its cross-section.

The radiation beam PB is incident on the patterning device (e.g. mask) MA, which is held on the support structure MT. Having traversed the patterning device MA, the beam PB passes through the lens PL, which focuses the beam onto a target portion C of the substrate W. With the aid of the second positioning device PW and position sensor IF (e.g. an interferometric device), the substrate table WT can be moved accurately, e.g. so as to position different target portions C in the path of the beam PB. Similarly, the first positioning device PM and another position sensor (which is not explicitly depicted in FIG. 1) can be used to accurately position the patterning device MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning devices PM and PW. However, in the case of a stepper (as opposed to a scanner) the support structure MT may be connected to a short stroke actuator only, or may be fixed. Patterning device MA and substrate W may be aligned using patterning device alignment marks M1, M2 and substrate alignment marks P1, P2.

The depicted apparatus can be used in the following preferred modes:

1. In step mode, the support structure MT and the substrate table WT are kept essentially stationary, while an entire pattern imparted to the beam PB is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the beam PB is projected onto a target portion C (i.e. a single dynamic exposure). The velocity and direction of the substrate table WT relative to the support structure MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the beam PB is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
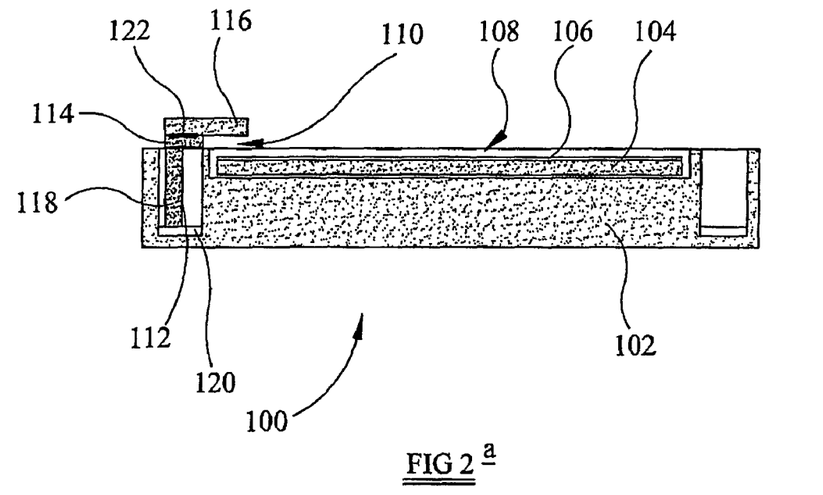

Referring to FIG. 2a, an apparatus 100 according to an embodiment comprises a substrate table 102 for supporting a substrate 104. The substrate comprises an upper surface having a photosensitive layer 106. The photosensitive layer 106 has exposure regions 108 and a peripheral exposure exclusion region 110.

The apparatus 100 further comprises a mask carrier 112, having an upper portion 114, for carrying a mask 116 above the peripheral exposure exclusion region 110 of the substrate 104, and a lower portion 118, which rests on a rail 120. The rail 120 extends around at least part of the periphery of a substrate supporting surface of the substrate table 102. In an embodiment, the rail 120 is located in a recess formed in the substrate table 102. Under the control of a controller, the mask carrier 112 is operable to travel on the rail 120. The range of movement of the mask carrier 112 circumnavigates (or partially circumnavigates) the substrate supporting surface of the substrate table 102.

The mask 116 is opaque to the wavelength of radiation (e.g. UV radiation) that activates the photosensitive layer 106. The mask 116 is detachably attachable to the mask carrier 112 by a switchable vacuum actuator 122. It will be appreciated that other actuators may be equally applicable such as, for example, an electrostatic actuator or an electromagnetic actuator.

The substrate table 102 further comprises a substrate clamp (not illustrated), for clamping the substrate 104 thereto. The substrate clamp is a vacuum actuator and operable to be active in the region of the substrate table which underlies a loaded substrate.

As described in relation to FIGS. 1, 2a, and 2b, in use, target portions 128, C of the substrate 104 are individually exposed to the radiation beam PB in sequence, until the whole substrate has been exposed (i.e. the substrate is scanned). Referring also to FIGS. 2b and 2c, the controller directs the mask carrier 112, along the rail 120, to dispose the mask 116 in a position which overhangs the peripheral exposure exclusion region 110 in each of the target portions 128 during exposure thereof, thereby preventing exposure of the peripheral exposure exclusion region 110.

Referring also to FIG. 2d, the mask carrier is also moveable radially outwards, relative to the loaded substrate 104, such that the mask 116 is moveable into a position in which it does not overhang the substrate 104. The substrate 104 is then removable from the substrate table 102 and another substrate 104 may be loaded thereon, without the substrates having to pass under the mask.

Figure 3:
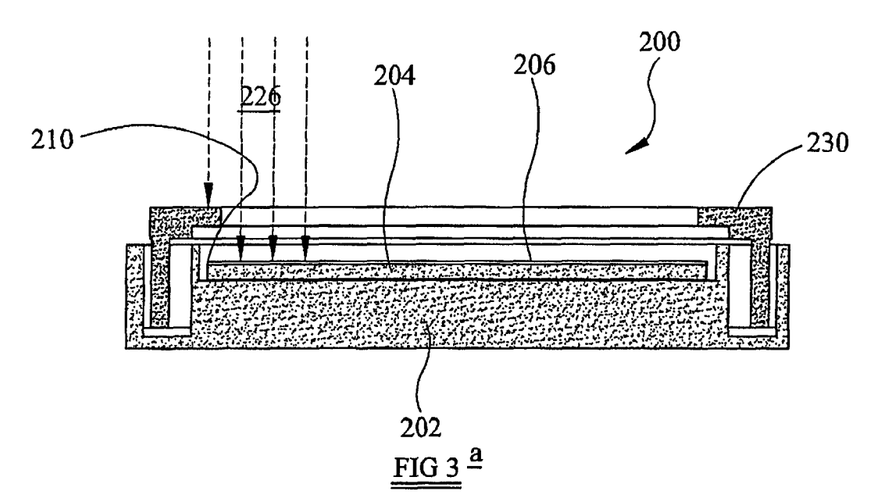

Referring to FIG. 3a, an apparatus 200 according to and embodiment comprises a mask in the form of a ring 230 disposed around, and radially spaced apart from, a substrate 204. Referring also to FIGS. 3b, 3c and 3d, the ring 230 has an internal diameter 232 sufficiently greater than an external dimension 234 of the substrate 204, such that, in use, the ring 230 is rotatable eccentrically, relative to the substrate 204. In use, in order to load and unload the substrate 204, onto and off a substrate table 202, the ring 230 is positioned concentrically relative to the substrate 204, as shown in FIG. 3b. The substrate 204 can then be loaded and unloaded without having to pass under the ring 230, which acts as the mask.

Referring to FIGS. 3a, 3c and 3d, during exposure of a photosensitive layer 206, disposed on the upper surface of the substrate 204, to radiation 226, a controller controls the eccentric rotation of the ring 230 to correspond with the sequence of target portions 228, being exposed. The ring is positioned at a height such that, as the ring rotates in an eccentric manner, a portion of the ring 230 overhangs a peripheral exposure exclusion region 210 within the target portion 228 being exposed to radiation 226, and is subsequently repositioned to correspond with the next target portion to be exposed in the sequence. Therefore, the positioning of the ring 230 provides a mask to prevent the peripheral exposure exclusion region 210 being exposed to the radiation 226.

The eccentric rotation of the ring 230, relative to the substrate 204, moves the ring over the substrate in a direction of the plane in which the substrate lies and therefore provides controlled and selected masking thereof.

Figure 4A:
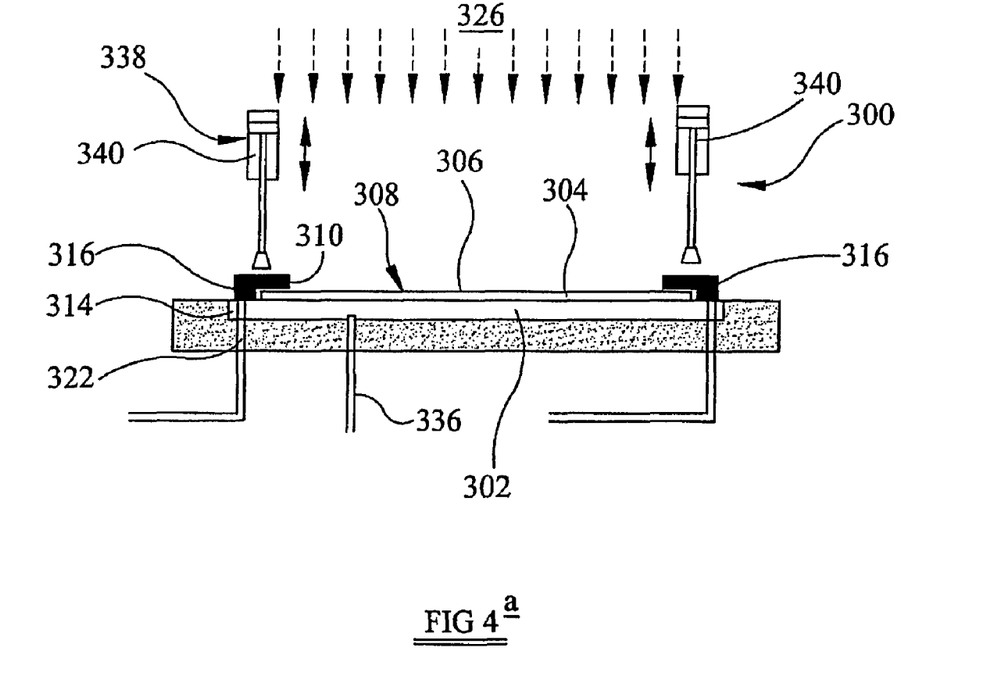
FIG. 4a is a schematic sectional drawing of an embodiment of the apparatus for masking a peripheral region of a wafer.

Referring to FIG. 4a, an apparatus 300 according to an embodiment comprises a substrate table 302 for supporting a substrate 304. The substrate comprises an upper surface which has a photosensitive layer 306 disposed thereon. The photosensitive layer 306 has exposure regions 308 and a peripheral exposure exclusion region 310.

The apparatus further comprises a mask 316 which, in use, rests on the substrate table 302 on a peripheral region 314 thereof. The mask 316 is in the form of a ring, but in other examples it may be in the form of an arcuate blade-like member. However, it will be appreciated that the mask may be of any other form depending on the application. The mask 316 is opaque to the wavelength of radiation used by the lithographic apparatus. The mask is positioned to overhang the peripheral exposure exclusion region 310 of the substrate. The mask acts to prevent the radiation beam of the lithographic apparatus being incident on the exclusion region 310 of the substrate.

The substrate table 302 comprises a mask clamp 322, for clamping the mask 316 thereto. The mask clamp 322 may, for example, be either a vacuum actuator, an electrostatic actuator or an electromagnetic actuator. The mask clamp 322 is operable to provide a clamping force around the peripheral region 314 of the substrate table directly underlying the peripheral region on which the mask 316 rests in use. For example, where the mask 316 is in the form of a ring, the mask clamp 322 is operable to provide a clamping force around the circumference of the peripheral region 314, underlying the loaded mask.

The substrate table 302 further comprises a substrate clamp 336, for clamping the substrate 304 thereto. The substrate clamp 336 is a vacuum actuator and is operable to be active in the region of the substrate table which underlies a loaded substrate.

The mask clamp 322 and the substrate clamp 336 may have servos located in the substrate table.

The apparatus 300 further comprises a mask loader 338. The mask loader 338 has two loading actuators 340 disposed above the mask 316 and diametrically opposed to each other, as shown in FIG. 4a. It will be appreciated that more or less loading actuators may be used, within the working of the present invention, depending on the specific application.

The loading actuators 340 may be either vacuum actuators, electrostatic actuators or electromagnetic actuators. Each loading actuator 340 is operable to travel in a direction perpendicular to the plane on which the substrate table 302 lies. However, a degree of lateral movement may occur, for example due to engineering tolerances.

In use, in the position of the apparatus in FIG. 4a, the substrate 304 and mask 316 are exposed to radiation 326 (e.g. UV radiation) thereby activating the exposure region 308 of the photosensitive layer 306. The mask 316 prevents exposure of the peripheral exposure exclusion region 310 thereby ensuring that the photosensitive surface lying thereunder is not activated.

From the position of the apparatus shown in FIG. 4a, the mask 316 is unloaded by lowering the loading actuators 340 onto the mask 316. The loading actuators 340 are actuated such that a vacuum or electromagnetic force attaches the mask 316 to the loading actuators 340. The mask is then lifted clear of the substrate table 302 and substrate 304, in a direction substantially perpendicular thereto. Therefore, the mask does not pass over any part of the exposure region 308. These steps are reversed to reload the mask 312.

Figure 4B:
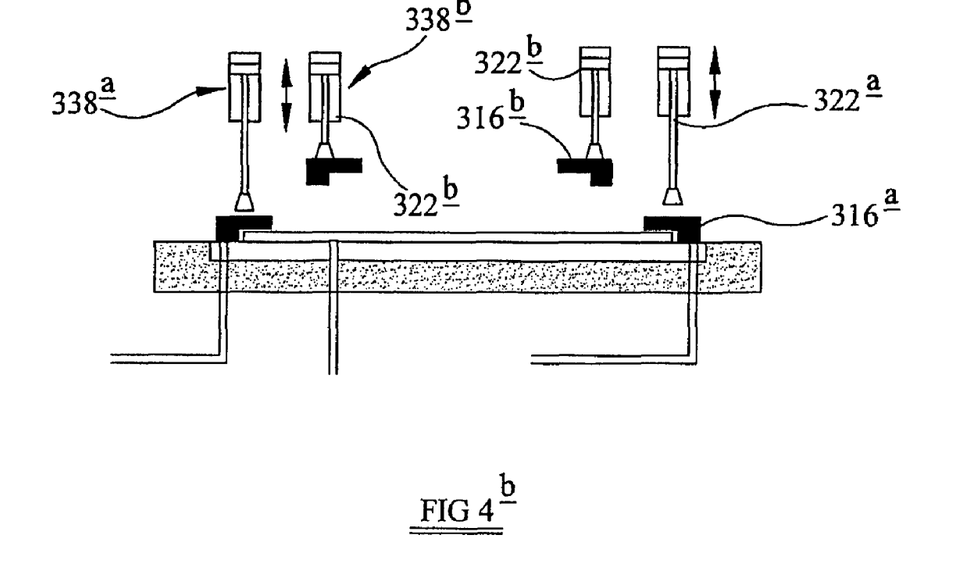
FIG. 4b is a schematic sectional drawing of the apparatus of FIG. 4a, adapted for use with more than one mask.

Referring to FIG. 4b, an apparatus according to an embodiment has a first mask 316a and a second mask 316b. Each mask, 316a and 316b, has an associated mask loader, 338a and 338b, with each mask loader having loading actuators 322a and 322b, respectively.

The first and second masks, 316a and 316b, are of a different size in diameter both internally and externally for use with different size substrates, or for different areas of exposure exclusion regions. For example, the first mask 316a may be used with a 12-inch (300 mm) diameter substrates and the second mask may be used with 8-inch (200 mm) diameter substrates. The term 'diameter' is not intended to imply that the masks are precisely circular. The masks may for example include a partially straight outer edge.

In use, the apparatus functions in the same manner as the apparatus of the first embodiment, except that when the first mask 316a is in the loaded position the second mask 316b is in a parked position, and vice versa.

Figure 5A:
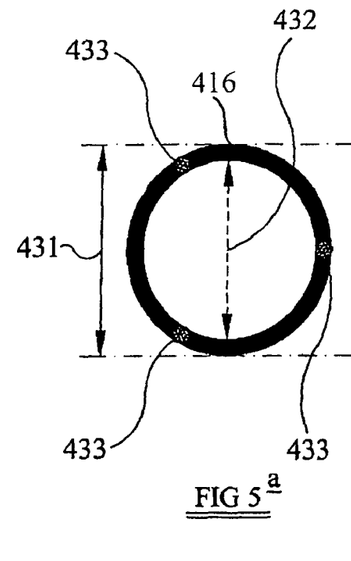
FIGS. 5a, 5b and 5c are schematic drawings of an embodiment of a mask of the apparatus for masking the peripheral region of the wafer.
Figure 5B:
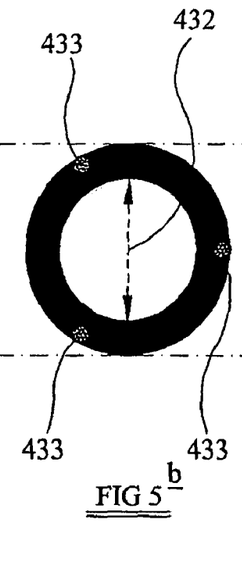
Figure 5C:
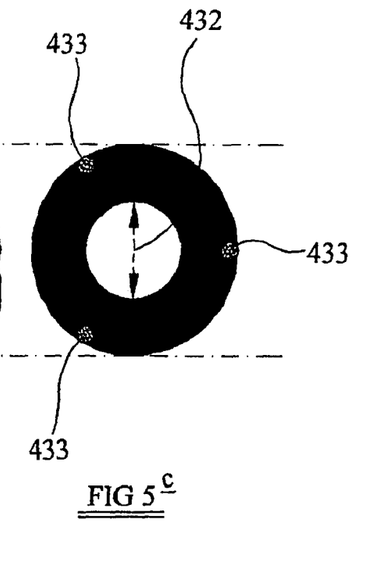

Referring to FIGS. 5a, 5b, and 5c, different embodiments of masks, according to the present invention, for use with the apparatus, described above, are shown. Specifically, a mask 416 is in the form of a ring. The mask has an external diameter 431 that corresponds with a typical sized substrate table and an inner diameter 432 for providing masking the peripheral exposure exclusion region of substrates of different sizes. For example, FIG. 5a shows a mask 416 for use with a 12 inch (300 mm) substrate, FIG. 5b shows a mask for use with an 8 inch (200 mm) substrate and FIG. 5c shows a mask for use with a 6 inch substrate (150 mm). Each of the masks shown in FIGS. 5a, 5b and 5c, have three contacts 433 operable for contacting a substrate table. The specific position of each contact, relative to the other two contacts on the same mask, allows each mask to be specifically positioned and orientated relative to the substrate table. Each mask, shown in FIGS. 5a, 5b and 5c, has contacts 433, which are the same distance apart and positioned in the same arrangement as those disposed on the other two masks. The three masks can therefore be considered as a set of masks which, by virtue of their contacts, can be loaded onto the same substrate table for providing exposure exclusion regions of three different radial dimensions and/or for providing exposure exclusion regions on substrates of different diameters. Only one of the masks will be present on the substrate table at any given time.

Figure 6A:
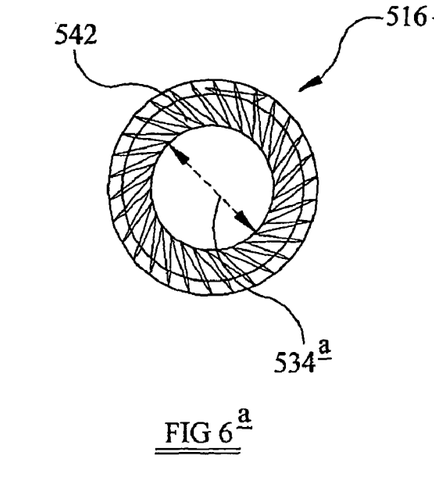
FIGS. 6a and 6b are schematic drawings of an embodiment of the mask.
Figure 6B:
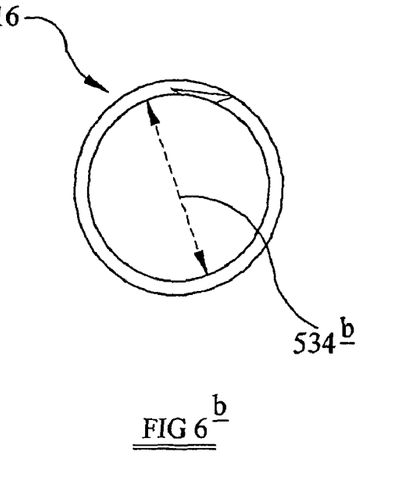

Referring to FIGS. 6a and 6b, an embodiment of a mask 516 is in the form of a ring and has a device to adjust the inner diameter thereof. For example, the inner diameter of the ring may be adjusted with a diaphragm 542. Referring to FIG. 6a, the diaphragm is adaptable to provide a reduced inner diameter 534a thereby providing a mask for a peripheral exposure exclusion region of a smaller diameter substrate, such as for example, a 6-inch (150 mm) diameter substrate. Referring to FIG. 6b, the diaphragm is also adaptable to provide a larger inner diameter 534b thereby providing a mask for a peripheral exposure exclusion region of a larger diameter substrate, such as for example, a 12-inch (300 mm) diameter substrate. It will be appreciated that the diaphragm will also be adaptable to provide an inner diameter of any dimension between the smaller and larger inner diameter and therefore is applicable to substrates of other diameters.

The above-mentioned masks are operable to be disposed to overhang the substrate, in relatively close proximity thereto. Illustrated in FIGS. 7a, 7b, 8a, and 8b are masks operable to be disposed between the projection device PL and the substrate W, as referred to in FIG. 1.

Figure 7A:
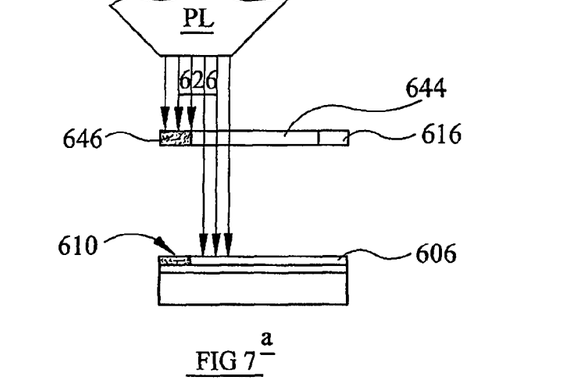
FIG. 7a is a schematic drawing of an embodiment of the mask, in use.
Figure 7B:
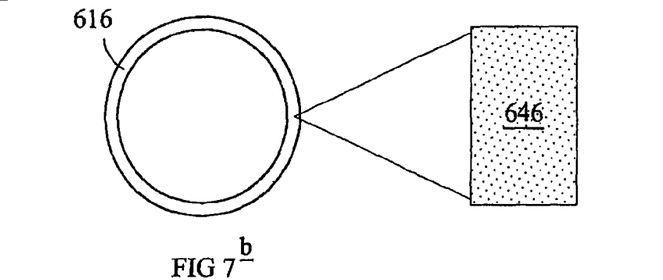

Referring to FIGS. 7a and 7b, a mask 616, according to an embodiment, is in the form of an optical panel, such as, for example, an LCD. In use, regions of such a mask are selectively switchable between being transparent 644 to the radiation 626, emitted from the projection device PL, and being opaque 646 to the same radiation. Selection of the opaque/transparent regions is carried out by a controller to correspond with the predetermined peripheral exposure exclusion regions 610 of a substrate 606 being exposed at that time. FIG. 7a schematically shows a sectional view of the apparatus in use. The mask 616 is exposed to radiation 626 whereby the opaque regions 646 cast a shadow on the substrate thereby masking the peripheral exposure exclusion regions 610 of the substrate accordingly.

FIG. 7b shows a plan view of the mask 616, wherein the selected opaque region 646 is shown enlarged. The controller switches a region of the mask from being transparent to opaque to correspond with the controlled positioning of the projection device PL.

Figure 8A:
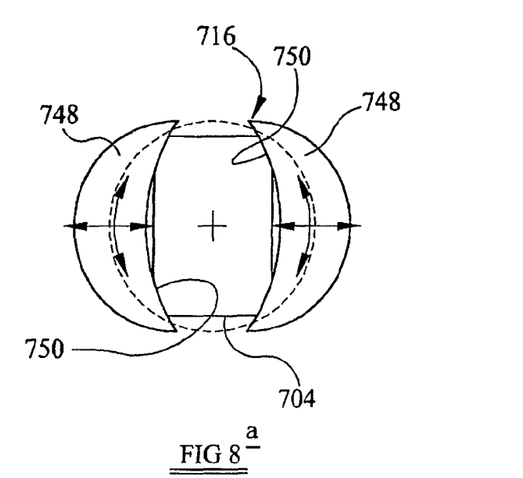
FIGS. 8a and 8b are schematic drawings, in plan view, of an embodiment of the mask.

Referring to FIG. 8a, a further embodiment of a mask 716, according to the present invention, is in the form of a pair of diametrically opposed shaped plates 748. Each plate having a concave shaped mask edge 750 and is preferably crescent shaped for practical convenience. As described for the above embodiment of a mask (with reference to FIG. 7a), the plates are disposed between the projection device and the substrate or substrate table. An exposure region of a substrate 704 is shown in FIG. 8a. The plates are opaque to the radiation emitted from the projection device, which activates the photosensitive layer of the substrate. The plates 748 are moveable, either simultaneously or independently, circumferentially and radially relative to the substrate or substrate table. In use, the plates are selectively positioned such that upon exposing the photosensitive layer, of the substrate, to the radiation, they cast a shadow on the substrate thereby masking the peripheral exposure exclusion regions of the substrate accordingly.

Figure 8B:
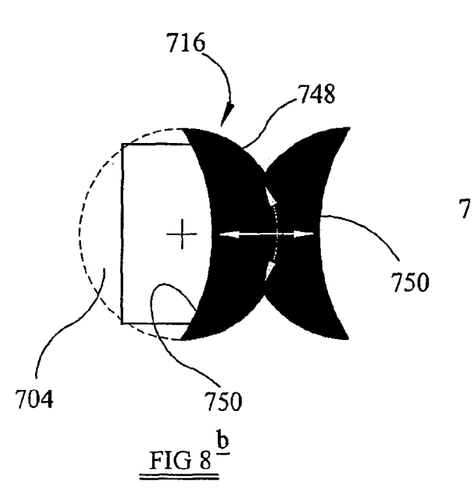

FIG. 8b shows an adaptation of the above mask 716, wherein the plates are joined on their convex curvature and is operable in the same manner to provide peripheral exposure exclusion regions.

The plates shown in FIGS. 8a and 8b may be located adjacent to the patterning device MA (see FIG. 1) provided in the lithographic apparatus. The plates may be placed in a focal plane of the illumination system IL.

Figure 9A:
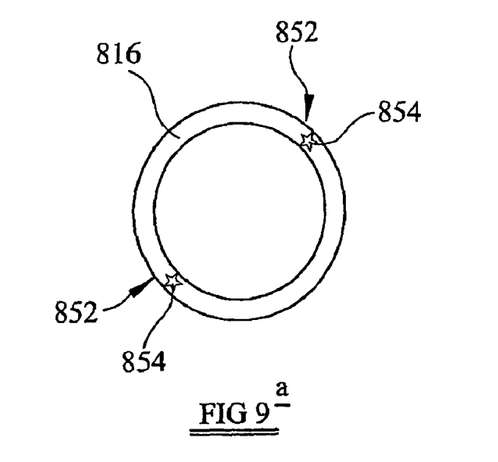
FIGS. 9a and 9b are schematic drawings, in plan view, of the mask having an alignment device.
Figure 9B:
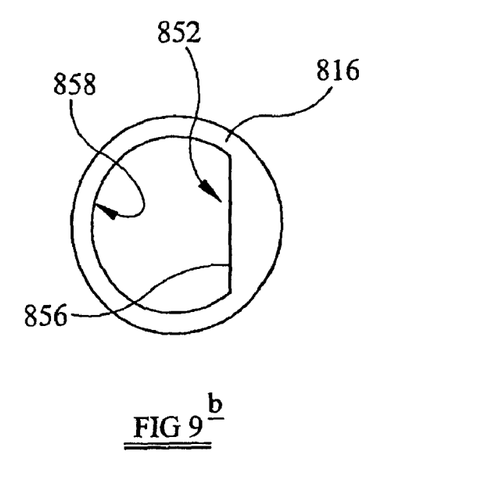

For each of the masks described herein, the mask should be initially positioned such that it is correctly aligned with the remainder of the lithographic apparatus and the substrate. This provides for correlation between the radiation (exposure target regions) and the mask. Referring to FIG. 9a, a mask 816, which may be considered as an equivalent of any of the masks described herein, has a mask aligner 852 in the form of two diametrically opposed alignment marks 854 for aligning the mask 816, as described above. It will be appreciated that any other number of alignment marks 854 may be used depending on the specific application of the mask. The alignment marks 854 may be used in combination with optical means such as a laser to form either a reflective or transmissive optical aligner. Referring to FIG. 9b, the mask 816 is shown having an alternative mask aligner 852 in the form of a flat region 856 of a portion of the inner circumference 858 of the mask. In use, the flat region aligns with a corresponding flat region of the circumference of the substrate.

Figure 10A:
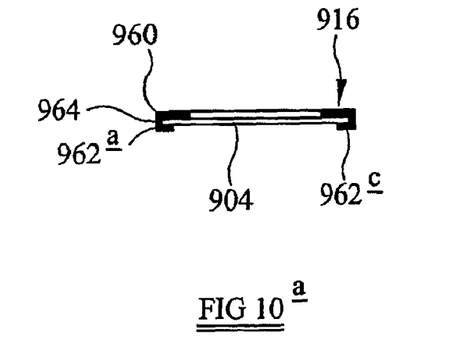
FIGS. 10a, 10b and 10c are schematic drawings of an embodiment of the mask.
Figure 10B:
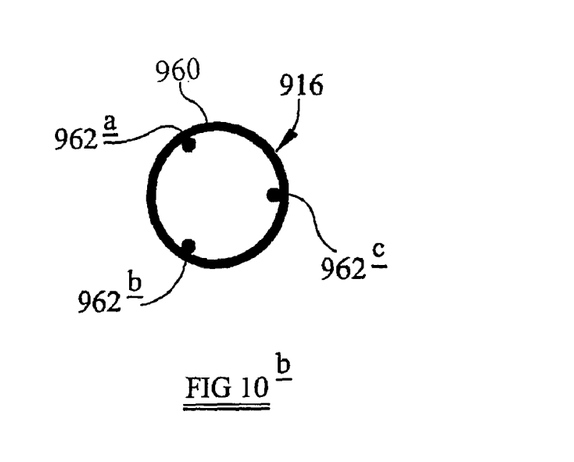
Figure 10C:
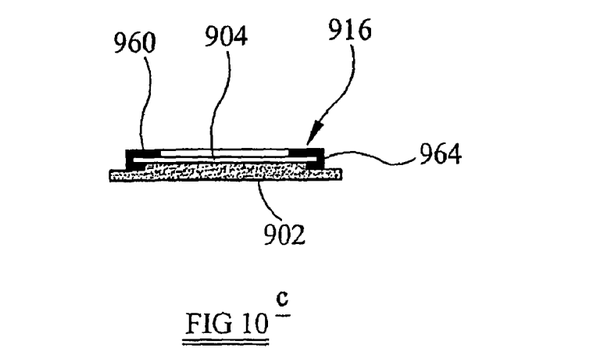

Referring to FIGS. 10a, 10b and 10c, an embodiment of an apparatus and a method comprises a mask 916, in the form of a ring 960, which is detachably attachable to a substrate 904 prior to loading the substrate onto the substrate table 902. The ring 960 has three circumferentially spaced apart resilient attachment tabs 962a, 962b and 962c, connected to, and spaced apart from, the ring 960 by a spacing wall 964, which depends from a peripheral region of the lower surface of the ring 960. The tabs, 962a, 962b and 962c, extend from the wall 964, in a direction perpendicular thereto, and radially inwards relative to the ring 960. A substrate receiver is thereby defined by each tab, 962a, 962b and 962c, the lower surface of the ring 960 and the wall 964. In use the resilient connection tabs, 962a, 962b and 962c, are temporarily bent to allow the substrate 904 to be inserted into each receiver. The connection tabs are then allowed to return to their normal position thereby holding the substrate 904 in position relative to the mask 916. The combination of the mask 916 and substrate 904 is then loaded onto the substrate table 902 for exposure.

In the embodiments above, the mask may be carried by the substrate table and be considered to be part of the substrate table. However, in these embodiments, the mask may also be mounted separately from the substrate table and moveable therewith by a separate motorized mounting mechanism.

While specific embodiments of the invention have been described above, it will be appreciated that the invention may be practiced otherwise than as described. The description is not intended to limit the invention.

What is claimed is:

1. A substrate table for a lithographic apparatus, the substrate table comprising a substrate support surface configured to support a substrate, and a mask constructed and arranged to prevent exposure of a peripheral exposure region of the substrate when the substrate is supported by the substrate support surface, wherein the mask is attached to a moveable carrier, the moveable carrier having a range of movement which at least partially circumnavigates the substrate support surface, wherein the substrate table further comprises a rail which at least partly circumnavigates the substrate support surface, the moveable carrier being arranged to travel along the rail.

2. The substrate table of claim 1, wherein the range of movement of the moveable carrier fully circumnavigates the substrate support surface.

3. The substrate table of claim 1, wherein the rail fully circumnavigates the substrate support surface.

4. The substrate table of claim 1, wherein the rail is located in a recess formed in the substrate table.

5. The substrate table of claim 1, wherein the mask is detachable from the moveable carrier, and is held in place on the moveable carrier by an actuator.

6. The substrate table of claim 5, wherein the actuator is a vacuum actuator, an electrostatic actuator, or an electromagnetic actuator.

7. The substrate table of claim 1, wherein the moveable carrier is configured to be moveable towards and away from the center of the substrate table, such that the mask may overhang the peripheral exposure region of the substrate during exposure of the substrate by the lithographic apparatus, and may then be moved away so that it no longer overhangs the substrate, thereby allowing the substrate to be easily removed from the substrate table.

8. The substrate table of claim 1, wherein the substrate table forms part of the lithographic apparatus, the lithographic apparatus further comprising an illumination system constructed and arranged to condition a beam of radiation, a support structure constructed and arranged to support a patterning device, the patterning device being configured to impart the radiation beam with a pattern in its cross-section, and a projection system constructed and arranged to project the patterned radiation beam onto a target portion of the substrate.

9. A lithographic apparatus comprising:
an illumination system constructed and arranged to condition a beam of radiation;
a support structure constructed and arranged to support a patterning device, the patterning device being configured to impart the radiation beam with a pattern in its cross-section;
a substrate table constructed and arranged to hold a substrate, the substrate table comprising a substrate support surface configured to support the substrate, and a rail which at least partly circumnavigates the substrate support surface;

a projection system constructed and arranged to project the patterned radiation beam onto a target portion of the substrate; and a mask having a concave edge, the mask being configured to be moveable on the rail around an optical axis of the lithographic apparatus and relative to the substrate to prevent a selected peripheral exposure region of the substrate from being exposed by the radiation beam.

10. The lithographic apparatus of claim 9, wherein the mask is located between the projection system and the substrate table.

11. The lithographic apparatus of claim 9, wherein the mask is carried by the substrate table.

* * * * *